United States Patent [19]
Goff

[11] Patent Number: 5,370,458
[45] Date of Patent: Dec. 6, 1994

[54] MONOLITHIC MICROWAVE POWER SENSOR

[75] Inventor: Miles E. Goff, Carlisle, Mass.

[73] Assignee: Lockheed Sanders, Inc., Nashua, N.H.

[21] Appl. No.: 595,067

[22] Filed: Oct. 9, 1990

[51] Int. Cl.[5] ........................................... H01L 29/66
[52] U.S. Cl. .................................. 374/122; 338/9;
338/20; 338/308; 338/27 R; 324/106; 257/467; 257/528
[58] Field of Search ................. 374/21, 32, 122, 178, 374/183, 185; 250/250; 324/95, 96, 106; 338/9, 20, 308, 22 R

[56] References Cited

U.S. PATENT DOCUMENTS

| | | | |
|---|---|---|---|
| 3,862,017 | 1/1975 | Tsunemitsu et al. | 357/51 X |
| 4,044,371 | 8/1977 | Abdelrahman et al. | 357/51 X |
| 4,065,742 | 12/1977 | Kendall et al. | 338/9 |
| 4,099,071 | 7/1978 | Thornburg | 324/106 |
| 4,489,104 | 12/1984 | Lee | 338/20 X |
| 4,498,071 | 2/1984 | Plough, Jr. et al. | 338/308 |
| 4,609,903 | 9/1986 | Toyokura et al. | 338/22 R X |
| 4,673,531 | 6/1987 | Lee | 338/20 X |
| 4,789,823 | 12/1988 | Delfs et al. | 357/28 |

OTHER PUBLICATIONS

Gupth, J. P. and Sachdev, R. N. "A Microwave Radiation Monitor," *Journal of Applied Meterology*, vol. 15, No. 9, pp. 1023–1026, Sep. 76.

DC to 40 GHz MMIC Power Sensor, Oct. 7, 1990, 1990 IEEE GaAs IC Symposium.

*Primary Examiner*—David C. Cain
*Attorney, Agent, or Firm*—David W. Gomes

[57] ABSTRACT

A monolithic integrated circuit power sensor provides a monolithic integrated circuit substrate a conversion element formed either on or in the substrate for converting microwave energy into heat, an electrically insulating dielectric layer affixed to the conversion element, and an integrated circuit, heat sensitive element formed in sufficiently close proximity to the conversion element to be thermally coupled thereto through the dielectric layer for sensing temperature changes in the conversion element.

8 Claims, 2 Drawing Sheets

MONOLITHIC MICROWAVE POWER SENSOR

BACKGROUND OF THE INVENTION

1. Field of the Invention

This invention generally relates to microwave power sensors and, in particular, to such sensors which are constructed integrally with a monolithic circuit substrate.

2. Statement of the Prior Art

Various devices have been used for sensing microwave power. Such devices typically use one of a variety of sensors for converting microwave energy into heat and for responding to the resulting temperature change. Known devices include Wallaston wires, thermistors and thermocouples used in waveguides and coaxial transmission lines. Typically the sensing element is used as a microwave termination requiring that the microwave s characteristics of the sensing element be matched to the input transmission line. For this reason, the sensing elements must be designed to have a low VSWR within the waveguide or coaxial mounting and must also have a temperature dependent electrical characteristic. Because of these requirements, power sensors which are operable over very broad frequency bands have not previously been developed.

Also, as the use of microwaves in communications and surveillance increases so does the demand for performance at higher and higher microwave frequencies. This performance is inhibited in traditional circuit components by increases in the reactive impedance attributable to higher operating frequencies. As reactive impedance is proportional to component size, there is a constant need for research and development of smaller circuitry, components, and devices to enable higher frequency performance.

SUMMARY OF THE INVENTION

Accordingly, it is the purpose of the present invention to provide a monolithic microwave power sensor operable over wide frequency ranges and having electrically separated microwave and heat sensing components for allowing optimal design of each separate component.

The device provides a monolithic integrated circuit substrate conversion means formed either on or in the substrate for converting microwave energy into heat, an electrically insulating dielectric layer affixed to the conversion means, and an integrated circuit, heat sensitive element formed in sufficiently close proximity to the conversion means to be thermally coupled thereto through the dielectric layer for sensing temperature changes in the conversion means.

In another form, the device provides a monolithic integrated circuit substrate, an integrated circuit structure whose temperature is to be sensed, formed either on or in the substrate, a dielectric layer deposited on the integrated circuit structure, and a thin film metal resistor having a temperature dependent resistance and being deposited on the dielectric layer in sufficiently close proximity tot he integrated circuit structure to be thermally coupled thereto.

In yet another form a monolithic integrated circuit substrate, an integrated circuit structure whose temperature is to be sensed, formed either on or in the substrate, and a temperature sensitive, semiconductor resistor formed in the substrate and in sufficiently close proximity to the integrated circuit structure to be thermally coupled thereto.

BRIEF DESCRIPTION OF THE DRAWINGS

The present invention is illustratively described in reference to the accompanying drawings of which.

DETAILED DESCRIPTION OF THE DRAWINGS

Figure 1:
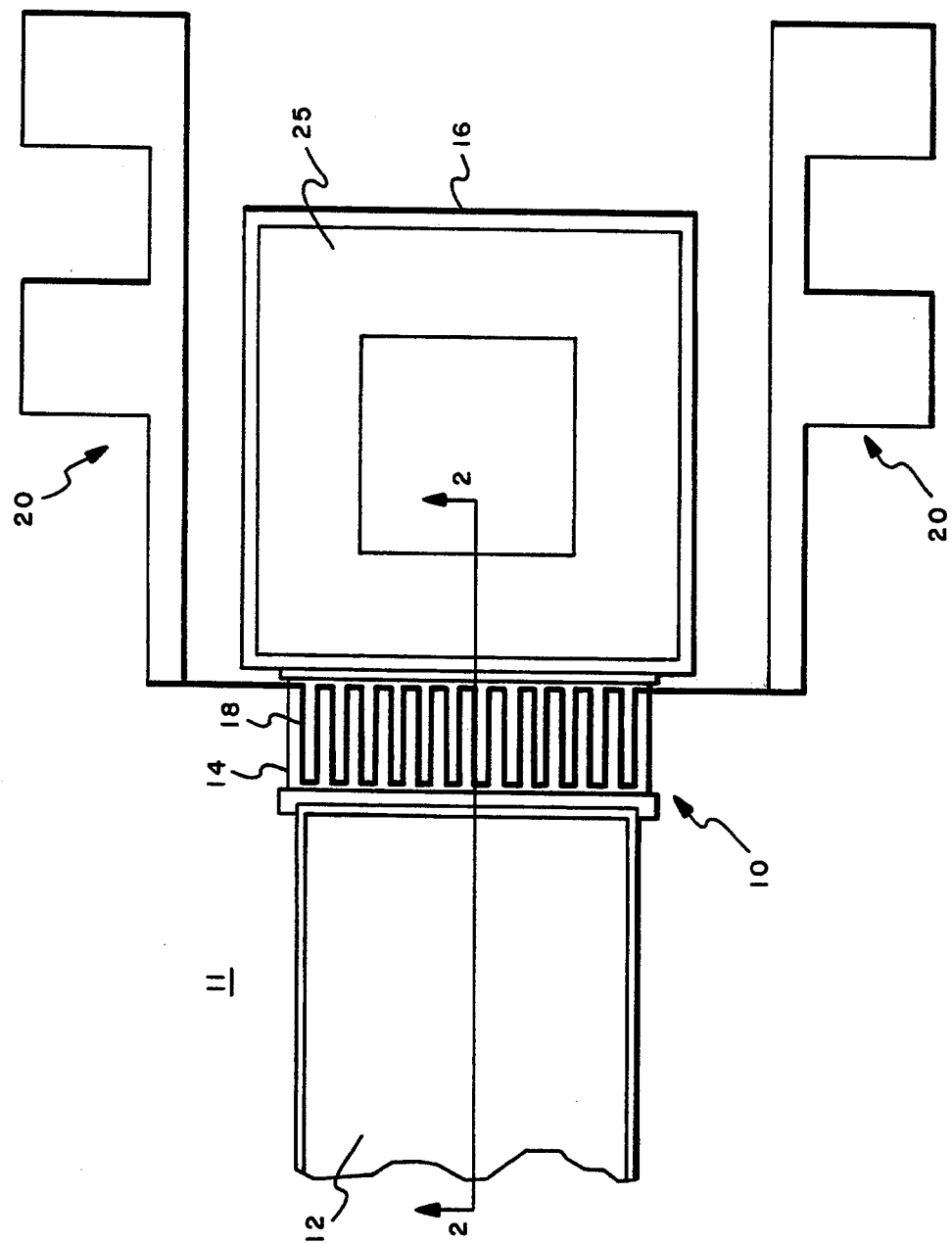
FIG. 1 is an enlarged top plan view of a portion of an integrated circuit including a microwave power sensor constructed in accordance with one embodiment of the present invention.

FIG. 1 generally shows a microwave power sensor 10 including a transmission line 12, a transmission line termination resistor 14, a via 16, a heat sensing element 18 and metal bonding pads 20 for the element 18. Transmission line 12 is a standard gold microstrip line, nominally (96) microns wide, for delivering microwave energy to resistor 14 and via 16. Resistor 14 is an ion implanted gallium arsenide, GaAs, bulk resistor constructed to have both the same width and the same impedance, in this case (50) ohms, as transmission line 12. The width of transmission line 12 is maintained for resistor 14 to avoid step discontinuities. The other end of resistor 14 is connected to ground, typically through a via 16 to the back plane of the substrate on which transmission line 12 and resistor 14 are constructed.

Figure 2:
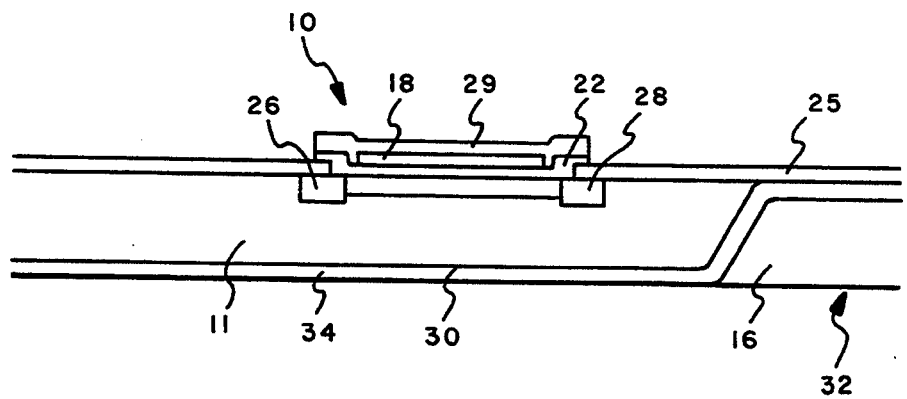
FIG. 2 is a cross-sectional view of the integrated circuit of FIG. 1 taken along view lines 2—2.

Located on top of a portion of transmission line 12, resistor 14 and via 16, is a dielectric layer 22, shown in FIG. 2. Dielectric layer 21 is formed from silicon nitride and is nominally (0.275) microns thick. The dielectric 22 is not shown in FIG. 1 for purposes of clarity in showing the alignment of the other components.

On top of the dielectric layer 21, there is formed a sensing element 18 in the form of a thin film metal strip. Sensing element 18 is constructed to meander back and forth across the top area of resistor 14 to achieve both the longest length possible and also the maximum amount of thermal coupling possible with resistor 14. The metal strip is also made narrow to increase both the possible length of the strip on top of the finite area of resistor 14 and to ultimately increase the resistance of the strip which improves the temperature sensitivity. In one embodiment the sensing element 18 is (1.0) micron wide and built on a resistor 14 which is (96) microns wide and (34) microns long. The strip is made of (0.05) microns of platinum on top of (0.05) microns of titanium.

The element 18 is also arranged symmetrically with respect to the electromagnetic field produced by microwave energy beneath resistor 14. This provides self-cancellation of any microwave energy coupled to the element 18, resulting in good isolation.

FIG. 2 shows a cross-section of the power sensor 19 of FIG. 1 taken along view lines 2—2. This cross-section is discussed below in conjunction with the processing steps used for construction of the embodiment. The basic principles of the monolithic construction process are well known as evidenced by the book *Monolithic*

*Microwave Integrated Circuits*, edited by Robert A. Pucel, 1985, IEEE Press. The specific steps used in constructing the present embodiment are as follows:

1. The top surface of the GaAs substrate 22 is first polished and cleaned.

2. The top of substrate 22 is then subjected to ion implantation of silicon atoms to reduce the intrinsic resistivity of the gallium arsenide to a value more suitable for the formation of a bulk gallium arsenide resistor.

3. The substrate 10 is then thermally annealed to repair crystal lattice damage and to achieve the appropriate activation of the implanted material. The heating is controlled to yield the desired sheet resistance for resistor 14 which will provide a (50) ohm termination resistance.

4. A layer of photoresist is applied to the surface and then patterned and developed to cover the area which will become resistor 14 and to expose the remainder of the surface. The exposed area is subjected to ion implantation of boron which raises the resistivity of the exposed substrate back to almost its intrinsic level and thereby isolates resistor 14. The photoresist is then cleaned off.

5. Another layer of photoresist is applied and then patterned and developed to expose the areas which will become ohmic contacts 26,28 for resistor 14.

6. Ohmic contacts 26,28 are formed on the exposed substrate using gold, germanium and nickel and a suitable metal deposition technique such as electron beam evaporation.

7. The photoresist is removed, and the ohmic contacts are suitably sintered to form low resistance electrical connections to the bulk gallium arsenide termination resistor 14.

8. Another layer of photoresist is applied to the surface and then patterned and developed to expose the areas which are to become the input transmission line 12, metal bonding pads 20, and the topside catch pad 25 for the via 16.

9. First metal layers of titanium, tungsten, and gold are deposited on the entire substrate including the photoresist and areas not covered by the photoresist.

10. The first metal layers are then removed using a metal liftoff technique in which a solvent is employed to float off the metal on top of the photoresist and leave metal adhered to the substrate forming the basis for transmission line 12, metal bonding pads 20 and the topside catch pad 25.

11. A thin layer of a dielectric 22, such as silicon nitride, is then deposited over the entire substrate using a plasma enhanced chemical vapor deposition technique.

12. A layer of photoresist is then applied to the dielectric 22 and suitably patterned and developed to expose the dielectric covering the first metal layers just deposited.

13. The dielectric material covering the metal is then removed using a standard, reactive ion etching process to reveal the metal.

14. The photoresist is then cleaned from the surface leaving a layer of silicon nitride dielectric 22 protecting areas including the resistor 14.

15. A new layer of photoresist is then applied and suitably patterned and developed to expose all areas where thick plated metal is desired, in particular transmission line 12, metal bonding pads 20 and catch pad 25.

16. A plating interconnect layer of metal is applied and the wafer is electroplated with gold to form thick layers required for transmission line 12, metal bonding pads 20, and catch pad 25.

17. The substrate is cleaned, and another layer of photoresist is applied and suitably patterned and developed in the shape of the temperature sensing element 18.

18. The surface is then covered with a thin film of titanium followed by a thin film of platinum using standard thin film metal deposition procedures.

19. The photoresist and the metal on top of it are then lifted off by the application of a suitable solvent leaving the thin films of titanium and platinum adhered to the dielectric layer 22 over the resistor 14 in the meandered pattern of element 18 shown in FIG. 1.

20. The surface is cleaned, and another layer of silicon nitride dielectric 29 is applied to serve as a passivation layer for the thin film metal of sensing element 18.

21. A layer of photoresist is applied and patterned and developed to expose areas of the dielectric 29 where no passivation layer is desired. These areas include metal bonding pads 20, transmission line 12, and catch pad 25.

22. The dielectric layer 29 is then removed from undesired areas using reactive ion etching techniques.

23. The substrate 11 is next thinned by precision grinding of the backside 30 while the topside of the wafer is protected from damage.

24. The backside 30 is then patterned and developed to expose an area for via 16, which area is then etched to create a hole 32 extending through to the topside catch pad 25.

25. The processing of the wafer is completed by applying titanium and gold to form the ground plane layer 34 on the backside of the substrate 11. This layer 34 connects to the topside catch pad 25 to complete the ground connection of via 16.

Figure 3:
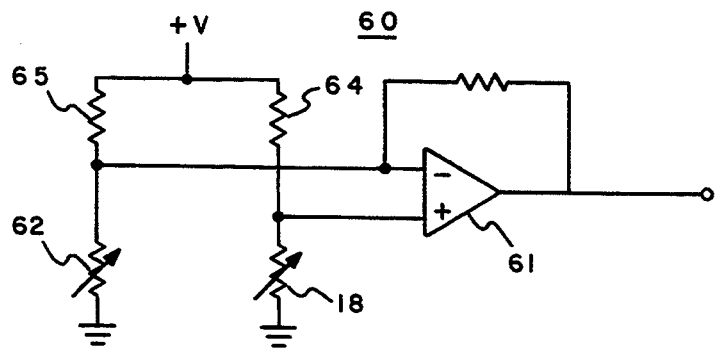
FIG. 3 is a schematic of a typical power sensing circuit intended for use with the sensor of FIGS. 1 and 2.

FIG. 3 shows a circuit 60 for converting the temperature dependent resistance variations of the sensing element 18 into an indication of the amount of microwave energy absorbed by the resistor 14. The circuit 60 is a bridge network having an a operational amplifier 61 to detect the difference between the two branches of the bridge. Element 18 is represented as a variable resistance which is matched to another temperature sensitive element 62. Element 62 is constructed on the monolithic substrate 11 to be identical to element 18. It is constructed during the same processing step and designed to have the same configuration and length. Like the element 18, it is located on top of the same layer of dielectric 22 and is thereby thermally coupled to the substrate 11 in the same manner as element 18, except for the resistor 14. Element 62 is not thermally coupled to resistor 14 but is located in the same general area so that it can act as a reference representing the ambient temperature of substrate 22.

The bridge circuit also includes a pair of matched resistors 64,65. By this arrangement the difference between the voltages from elements 18 and 62 represent the difference in heating caused by the absorption of microwave energy by resistor 14. This voltage difference may be appropriately scaled to provide a measurement of microwave power.

Figure 4:
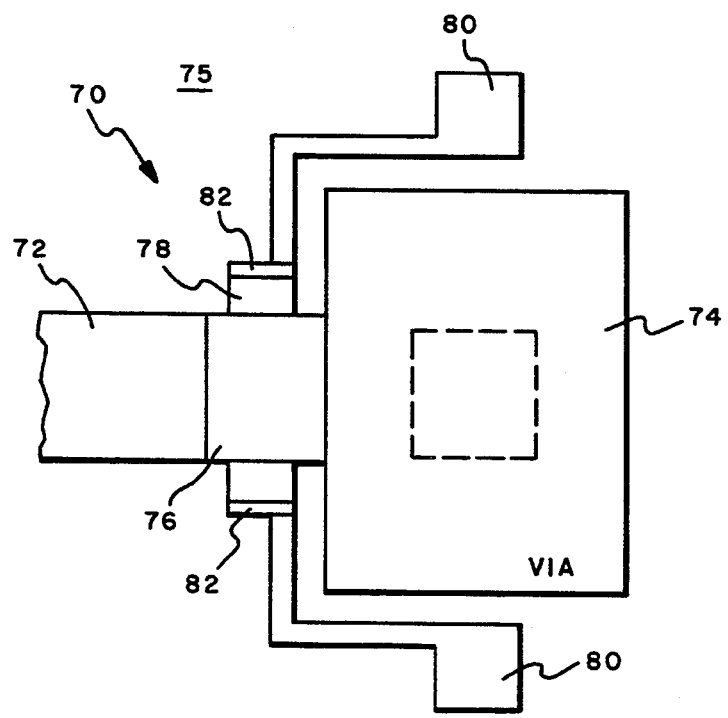
FIG. 4 is a top plan view of a microwave power sensor constructed in accordance with another embodiment of the present invention.

FIG. 4 shows another embodiment of the present invention. This embodiment generally includes a power sensor 70 coupled to a transmission line 72 and a via 74, all of which are located on a substrate 75. Sensor 70 includes a thin film metal resistor 76 for converting microwave energy to heat and a resistor 78 in the form of a semiconductor region formed directly in the monolithic substrate 75. Resistor 78 is connected to a pair of bonding pads 80 by means of a pair of ohmic contacts 82.

Sensor 70 operates in a manner similar to the sensor 10 in that its resistance is temperature dependent and therefore indicative of the power absorbed by resistor 76. Sensor 70 may be coupled to a bridge circuit similar to 60 where the element 62 is a semiconductor region identical to resistor 78.

The sensor 70 may also be constructed in a manner very similar to that described for sensor 10. The construction process would differ in that the steps for constructing resistor 14 would be used to construct resistor 78 and the thin film resistor 76 would be constructed in place of the element 18.

CONCLUSION

The present invention allows a power sensor to be constructed which has an extremely small size which enables very high frequency operation without deleterious parasitic effects. The microwave termination function and the temperature sensing function are accomplished in electrically isolated but thermally coupled structures, allowing each to be separately designed for optimal performance. This is especially significant for the purpose of impedance matching the sensor to the transmission line over a very broad frequency range. Any mismatch of the sensor to the line causes energy to be reflected back into the line instead of allowing it to be absorbed by the line termination and converted to heat. Any energy which is not so converted represents an inaccuracy of the power sensor. As the amount of energy reflected by a mismatch varies with frequency, the amount of inaccuracy in the sensor would also vary with frequency. The broadband matching of the present invention provides a greatly improved power sensor. For example, the embodiment described above provides a return loss to the line of greater than 20 db over the frequency range of DC to 40 Ghz. This means that over 99% of the power delivered to the transmission line over that vast frequency range is converted to heat, thus providing very accurate measurement over the entire range.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. An integrated circuit device for sensing microwave power, comprising:
   a monolithic integrated circuit substrate;
   conversion means formed in the substrate for converting microwave energy into heat;
   an electrically insulating dielectric layer deposited on the conversion means; and
   a thin film metal resistor having a temperature dependent resistance and being deposited on the dielectric by integrated circuit techniques directly over the conversion means to be thermally coupled thereto through the dielectric layer for sensing temperature changes in the conversion means.

2. The integrated circuit device of claim 1, wherein the substrate is gallium arsenide and further wherein the conversion means is formed by ion implanting a portion of the gallium arsenide.

3. The device of claim 1, wherein the thin metal film resistor is elongated and is constructed to have the longest length possible over the conversion means for increasing the resistance of the resistor and the thermal coupling to the conversion means.

4. The device of claim 2 wherein the thin metal film resistor is formed with titanium and platinum.

5. The device of claim 4, wherein the thin metal film resistor is also formed with gold.

6. The device of claim 5, wherein the dielectric is formed with silicon nitride or silicon oxide.

7. The device of claim 3, wherein the elongated metal film resistor is arranged symmetrically with respect to any electromagnetic field produced in the conversion means for providing self-cancellation of any energy coupled to the resistor.

8. The device of claim 6, further comprising circuit means responsive to the heat sensitive element for generating a signal indicative of the microwave energy received by the conversion means.

* * * * *